(12) United States Patent
Brickell

(10) Patent No.: US 6,198,498 B1
(45) Date of Patent: Mar. 6, 2001

(54) DUAL FORWARD AND REVERSE TEST POINTS FOR AMPLIFIERS

(75) Inventor: John W. Brickell, Lawrenceville, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/170,866

(22) Filed: Oct. 13, 1998

(51) Int. Cl.[7] .............................. H04N 7/00; H04N 7/04; H04N 9/10; H04N 9/14
(52) U.S. Cl. .................. 348/12; 346/12; 346/13; 346/180; 346/192
(58) Field of Search ................ 455/5.1, 3.1; 348/12, 348/13, 6, 10, 180, 181, 192, 193; H04N 7/00, 7/04, 9/10, 9/14

(56) References Cited

FOREIGN PATENT DOCUMENTS

WO 9747103  11/1997  (WO) .

Primary Examiner—Nathan Flynn
Assistant Examiner—Vivek Srivastava
(74) Attorney, Agent, or Firm—Kelly A. Gardner; Kenneth M. Massaroni; Hubert J. Barnhardt, III

(57) ABSTRACT

A communication system (100) processes forward signals generated by headend equipment (105) and reverse signals generated by subscriber equipment (135). A communication medium (110, 120), such as fiber optic cable or coaxial cable, couples the headend equipment (105) and the subscriber equipment (135), and amplifiers (400) are positioned at various locations along the medium (110, 120) to amplify the forward and reverse signals. The amplifiers (400) include a dual forward/reverse test circuit (FIG. 5) having a forward test point (406) coupled to the forward signal, a reverse test point (408) coupled to the reverse signal, and a single directional coupler (404) connected to the forward test point (406), for providing the forward signal thereto, and to the reverse test point (408), for providing the reverse signal thereto.

18 Claims, 3 Drawing Sheets

DUAL FORWARD AND REVERSE TEST POINTS FOR AMPLIFIERS

FIELD OF THE INVENTION

This invention relates generally to amplifiers, and more specifically to test points within amplifiers.

BACKGROUND OF THE INVENTION

Communication systems, such as two-way cable television systems, typically process signals in both the forward, or downstream, direction and the reverse, or upstream, direction. These signals may travel long distances and, as a result, distribution amplifiers are typically employed to amplify the signal levels of the forward and reverse signals.

Within these amplifiers, and within other electronic devices that process the distributed signals, it is desirable to provide test points coupled to the forward and reverse signals so that a technician can access the test points to analyze the nature, extent, and location of system problems or failures. Generally, within amplifiers, separate test points for the forward signal are provided prior and subsequent to forward signal amplification. Separate test points for the reverse signals are also provided prior and subsequent to reverse signal amplification. Therefore, within a single amplifier, four different test points are provided. Since each test point requires a separate directional coupler to pull off a portion of the signal to be tested, this multiplicity of test points within a single amplifier increases both the cost and the size of the device.

Thus, what is needed is an inexpensive and space-saving way to provide test points within an electronic device of a communication system.

DETAILED DESCRIPTION OF A PREFERRED EMBODIMENT

Figure 1:
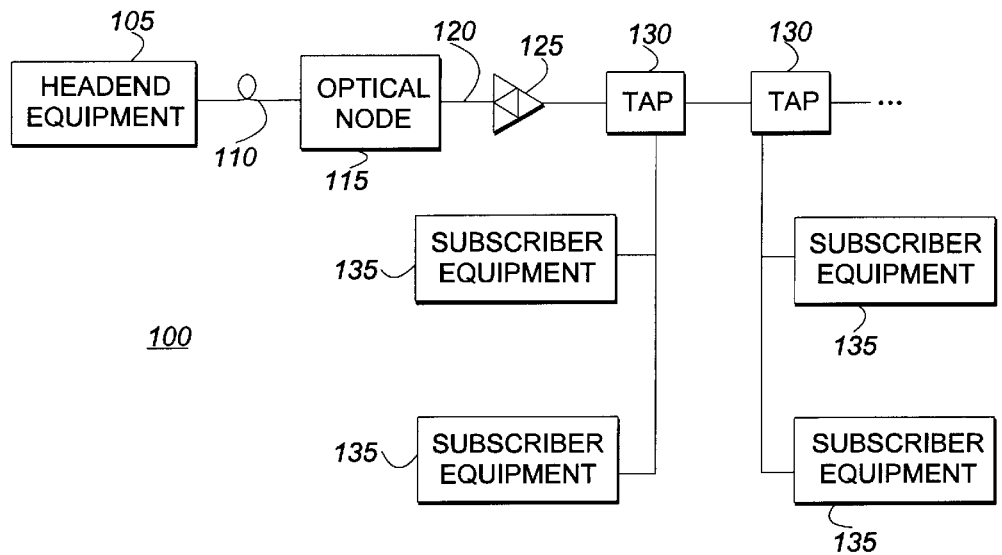
FIG. 1 is a block diagram of a conventional communication system.

A conventional two-way communication system 100, such as a cable television system, is depicted in FIG. 1, which shows headend equipment 105 for generating forward signals that are transmitted in the downstream direction along a communication medium, such as fiber optic cable 110, to an optical node 115 that converts optical signals to radio frequency (RF) signals. The RF signals are further transmitted along another communication medium, such as coaxial cable 120, and are amplified, as necessary, by distribution amplifiers 125 positioned along the communication medium. Taps 130 included in the cable television system 105 split off portions of the forward signals for provision to subscriber equipment 135, such as set top terminals, computers, and televisions. In a two-way system, the subscriber equipment 135 can also generate reverse signals that are transmitted upstream, amplified by any distribution amplifiers 125, converted to optical signals, and provided to the headend equipment 105.

Figure 2:
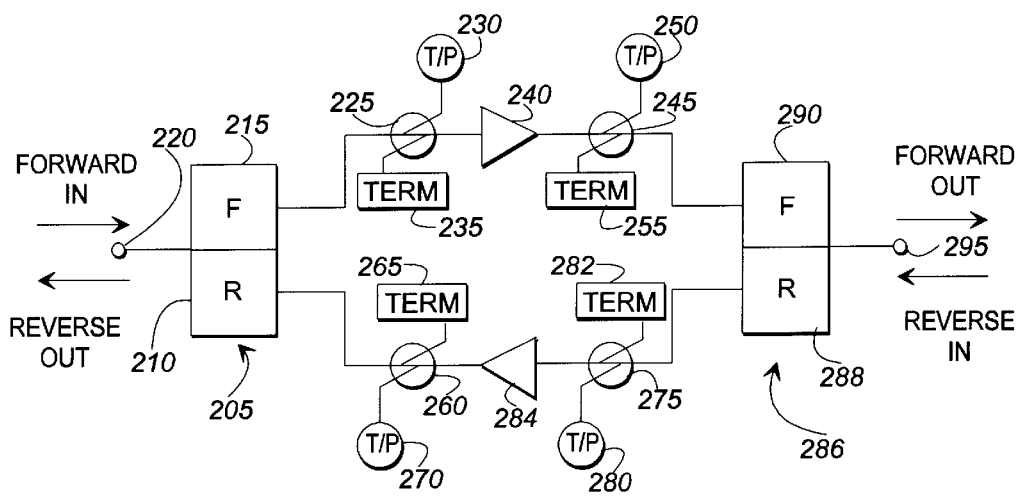
FIG. 2 is an electrical block diagram of a conventional test point circuit arrangement for use in an amplifier of the conventional communication system of FIG. 1.

Referring next to FIG. 2, an electrical block diagram of an amplifier 125 is depicted. The amplifier 125 includes a first port 220 for receiving forward signals and for outputting amplified reverse signals. A second port 295 outputs amplified forward signals and receives reverse signals from subscriber equipment 135. Coupled to the first port 220 is a diplex filter 205 including both forward and reverse sections 210, 215. The forward filter 215 blocks the reverse signal and passes the forward signal to a gain stage 240, where the forward signal is amplified. The amplified forward signal continues along the forward electrical path to the forward section 290 of another diplex filter 286. The amplified forward signal is passes to the second port 295, which is coupled to a communication medium for distributing the amplified forward signal through the communication system.

The second port 295 also receives a reverse signal, which is provided to the diplex filter 286. The diplex filter 286, via reverse section 288, blocks the forward signal and passes the reverse signal along a reverse electrical path to a reverse gain stage 284. After amplification, the reverse signal is provided to the first port 220 by the reverse section 210 of the diplex filter 205.

As mentioned briefly in the Background of the Invention, it is desirable to provide various testing points within the communication system 100 (FIG. 1) to pinpoint errors within the system. In particular, devices, such as the amplifier 125, that process the forward and reverse signals typically include test points both before and after all gain stages so that location of an error or failed device can be narrowed down within the system 100. This is conventionally done by using a directional coupler to split off a portion of the signal to be tested. Since use of each directional coupler introduces loss in the signal path, forward test points 230, 250 have typically been located on the forward side of the diplex filter 205 so that only the forward signal is affected. Similarly, reverse test points 270, 280 have typically been located on the reverse side of the diplex filter 286 so that only the reverse signal is affected.

Specifically, in amplifier 125, a first forward test point 230 is provided after the forward section 215 of diplex filter 205 and before the forward gain stage 240, and a second forward test point 250 is provided after the forward gain stage 240 and before the forward section 290 of diplex filter 286. A first reverse test point 280 is provided after the reverse section 288 of diplex filter 286 and before the reverse gain stage 284, and a second reverse test point 270 is provided after the reverse gain stage 284 and before the reverse section 210 of diplex filter 205. For each test point, a single directional coupler 225, 245, 260, 275 is provided to couple the signal to be tested to the test point, and other directional coupler outputs are coupled to terminations 235, 255, 265, 282, such as conventional resistor networks.

As can be seen from the amplifier 125 of FIG. 2, each test point has, in the prior art, required a dedicated directional coupler, other points of which are terminated in a known manner. As a result, a relatively large amount of space can be consumed by test point circuitry, and each additional test point requires the purchase and assembly of additional components.

Figure 3:
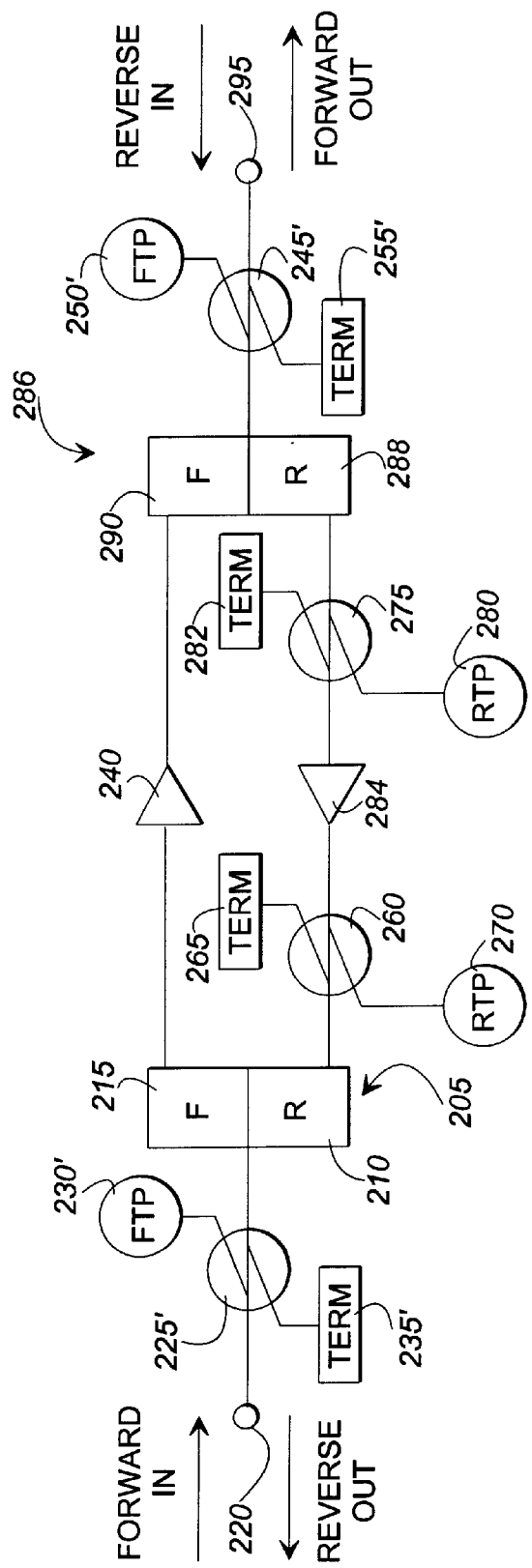
FIG. 3 is an electrical block diagram of another conventional test point circuit arrangement for use in an amplifier of the conventional communication system of FIG. 1.

FIG. 3 shows an alternative placement of test point circuitry in a conventional amplifier 125'. In this arrangement, the reverse test points 270, 280 are located as in FIG. 2. However, the forward test points 230', 250' are located on the port sides, i.e., the external sides, of the diplex filters 205, 286. The forward test points 230', 250' still each include a single directional coupler 225', 245', other ports of which are terminated with known termination circuits 235', 255'. This test point location permits injection of a reverse signal into the forward test point, thereby easing setup of the reverse signal path in the amplifier 125'. The reverse injected signal can be sent in the reverse band upstream to the headend equipment 105 (FIG. 1), where a picture of the reverse spectrum can be taken. The picture is then modulated on a forward band carrier and sent back in the forward, or downstream, path. The picture can be read from the same forward test point in order to balance the amplifier 125'.

The problem with the test point arrangement of FIG. 3 is that additional loss is realized in the reverse path, since the forward test points 230', 250' have been moved to the port sides of the diplex filters 205, 286. This loss is due to the insertion loss of the directional couplers 225', 245', which are now a part of the reverse path. As a result, the gain, noise figure, and distortion of the amplifier 125' can be negatively affected.

Figure 4:
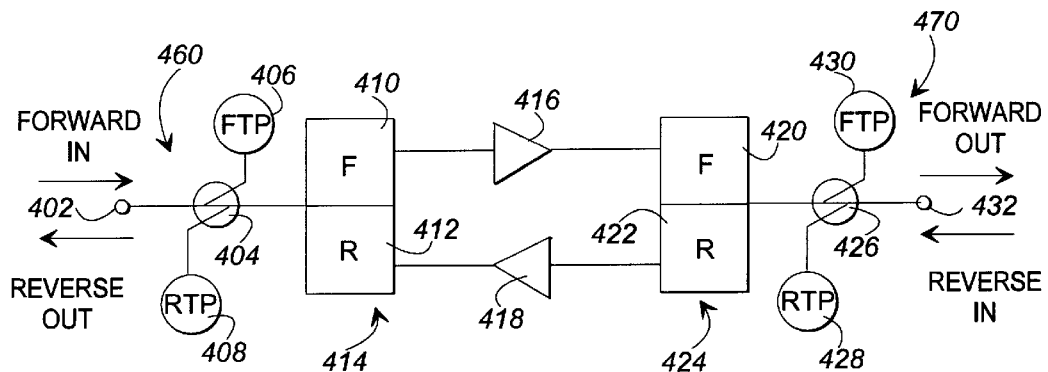
FIG. 4 is an electrical block diagram of a test point circuit arrangement for use in an amplifier according to the present invention.

Referring next to FIG. 4, an amplifier 400 having a dual forward and reverse test point circuit arrangement is shown according to the present invention. The amplifier 400 can be substituted for conventional amplifiers 125, 125' within the communication system 100. The amplifier 400, like other amplifiers, includes a first port 402 for receiving a forward signal and for providing an amplified reverse signal, a second port 432 for receiving a reverse signal and for providing an amplified forward signal, diplex filters 414, 424, and gain stages 416, 418. More specifically, the forward signal is received at port 402, forwarded by forward section 410 of diplexer 414, amplified by forward gain stage 416, and passed to port 432 by forward section 420 of diplexer 424. The reverse signal is received at port 432, forwarded by reverse section 422 of diplexer 424, amplified by reverse gain stage 418, and passed to port 402 by reverse section 412 of diplexer 414.

In accordance with the present invention, a dual forward and reverse test point circuit 460 is located in the upstream section of the amplifier 400, between the first port 402 and the first diplex filter 414. The upstream test circuit 460 includes a single directional coupler 404 coupled to both a forward test point 406 and a reverse test point 408. A second, downstream test point circuit 470 is located between the second diplex filter 424 and the second port 432. The downstream test circuit 470 similarly includes a single directional coupler 426 coupled to both a forward test point 430 and a reverse test point 428. In this manner, less loss is introduced into the forward and reverse signal paths of the amplifier 400 than is the case for prior art amplifiers 125, 125', and gain, noise figure, and amplifier distortion are only minimally impacted.

Figure 5:
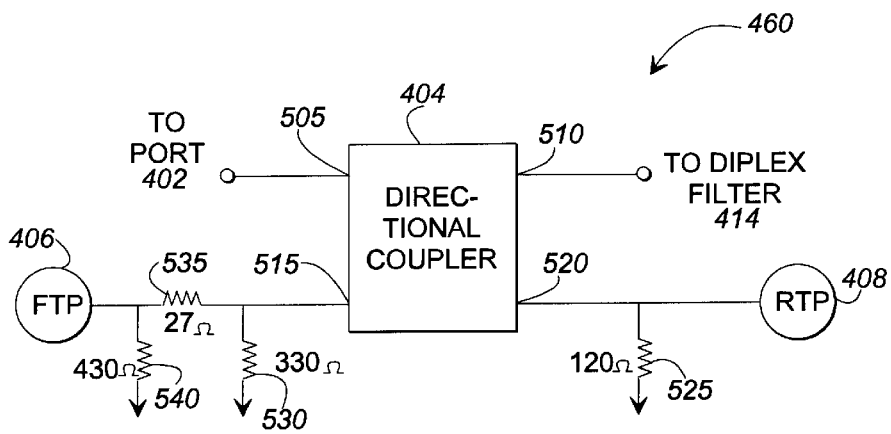
FIG. 5 is an electrical circuit diagram of circuitry for implementing dual forward and reverse test points in the test point circuit arrangement of FIG. 4 in accordance with the present invention.

FIG. 5 is an electrical circuit diagram of a dual forward and reverse test point circuit 460 according to the present invention. As shown, a single directional coupler 404 is employed. The directional coupler 404 can be, for instance, a four port coupler such as a MaCom EMDC-17-5-75 coupler. A forward input terminal 505 of the directional coupler 404 is coupled to port 402 (FIG. 4) of the amplifier 400, and a reverse input terminal 510 is coupled to the diplex filter 414. A forward output terminal 515 is coupled to the forward test point 406, and a reverse output terminal 520 is coupled to the reverse test point 408. In prior art forward test point circuits, on the other hand, the reverse output terminal 520 is normally terminated.

One major issue with this new approach is that the forward test point response must be realized with an unterminated reverse output terminal 520. This issue is resolved by locating attenuation circuits at both the forward and reverse output terminals 515, 520 of the directional coupler 404 to provide the required attenuation, e.g., 3 dB using a 17 dB coupler to yield a 20 dB test point. Since the forward test point 406 requires a precise termination, a single resistor 525 that offers a 3 dB insertion loss can be used. The resistor 525 should be reasonably close to 75 ohms, and, in a tested device, a 120-ohm resistor coupled between the reverse output terminal 520 and a ground voltage sufficed. Since the reverse test point does not require as exact of a termination, the forward output terminal 515 can use a typical PI resistive attenuator pad comprising a first resistor 535 connected between the forward output terminal 515 and the forward test pad 406, a second resistor 530 coupled between the forward output terminal 515 and a ground voltage, and a third resistor 540 coupled between the forward test point 406 and the ground voltage. By way of example, resistor 535 was 27 ohms, resistor 530 was 330 ohms, and resistor 540 was 430 ohms. It will be appreciated that other attenuator arrangements, such as a T resistive attenuator pad, could alternatively be used.

In summary, the dual forward and reverse test point circuit is suitable for use in any device, such as an amplifier, that processes both forward and reverse signals. The dual forward and reverse test point circuit as described above includes a single directional coupler with four ports: a first for receiving the forward signal, a second for receiving the reverse signal, a third for coupling to the forward test point, and a fourth for coupling to the reverse test point. As a result, fewer components are used in the amplifier to provide the same number of test points as in prior art devices. Furthermore, the amplifier using the test point circuit of the present invention provides better noise figure performance, greater gain, and less distortion than prior art amplifiers.

What is claimed is:

1. A dual forward and reverse test point circuit, comprising:
    a single directional coupler having first, second, third, and fourth ports, wherein the first port receives a forward signal input and provides a reverse signal output, and wherein the second port receives a reverse signal input and provides a forward signal output;
    a reverse test point connected to the fourth port;
    a first attenuator connected to the reverse test point and the fourth port;
    a forward test point coupled to the third port; and
    a second attenuator connected between the forward test point and the third port.

2. The dual forward and reverse test point circuit of claim 1, wherein:
    the first attenuator comprises a resistor having first and second ends, the first end connected to the reverse test point and the fourth port, and the second end coupled to a ground voltage.

3. The dual forward and reverse test point circuit of claim 2, wherein:
    the second attenuator comprises a PI resistive network.

4. The dual forward and reverse test point circuit of claim 2, wherein:
    the second attenuator comprises first, second, and third resistors, the first resistor having a first end directly connected to the third port and having a second end directly connected to the forward test point, the second resistor having a first end connected to the third port and having a second end coupled to the ground voltage, and the third resistor having a first end connected to the forward test point and having a second end coupled to the ground voltage.

5. An electronic device for processing both forward and reverse signals in a communication system, the electronic device comprising:
an electrical path along which both the forward and reverse signals flow; and
a test circuit located on the electrical path, comprising:
a forward test point coupled to the forward signal;
a reverse test point coupled to the reverse signal; and
a single directional coupler connected to the electrical path for coupling the forward signal to the forward test point and for coupling the reverse signal to the reverse test point.

6. The electronic device of claim 5, further comprising:
a port for receiving the forward signal and for outputting the reverse signal; and
a diplex filter for passing the forward signal and blocking the reverse signal,
wherein the test circuit is coupled between the port and the diplex filter.

7. The electrical device of claim 5, further comprising:
a port for receiving the reverse signal and for outputting the forward signal; and
a diplex filter for passing the reverse signal and blocking the forward signal,
wherein the test circuit is coupled between the port and the diplex filter.

8. The electrical device of claim 5, further comprising:
a first port for receiving the forward signal and for outputting the reverse signal;
a first diplex filter for passing the forward signal and blocking the reverse signal, wherein the test circuit is coupled between the first port and the first diplex filter;
a second electrical path along which both the forward and reverse signals flow;
a second test circuit located on the second electrical path, comprising:
a forward test point coupled to the forward signal;
a reverse test point coupled to the reverse signal; and
a single directional coupler connected to the electrical path for coupling the forward signal to the forward test point and for coupling the reverse signal to the reverse test point;
a second port for receiving the reverse signal and for outputting the forward signal; and
a second diplex filter for passing the reverse signal and blocking the forward signal, wherein the second test circuit is coupled between the second port and the second diplex filter.

9. The electronic device of claim 5, wherein the electrical device comprises an amplifier.

10. An amplifier for a communication system that transmits both forward and reverse signals, the amplifier comprising:
a first port for receiving a forward signal and for outputting a reverse signal;
a second port for outputting the forward signal and for receiving the reverse signal;
a first diplex filter coupled to the first port for filtering signals at the first port to provide the forward signal to a first gain stage such that the forward signal is amplified prior to coupling to the second port;
a second diplex filter coupled to the second port for filtering signals at the second port to provide the reverse signal to a second gain stage such that the reverse signal is amplified prior to coupling to the first port; and
a test circuit located on an electrical path within the amplifier, the electrical path providing both the forward signal and the reverse signal, the test circuit comprising:
a forward test point coupled to the forward signal;
a reverse test point coupled to the reverse signal; and
a single directional coupler connected to the electrical path for coupling the forward signal to the forward test point and for coupling the reverse signal to the reverse test point.

11. The amplifier of claim 10, wherein:
the test circuit is connected between the first port and the first diplex filter;
the forward test point provides access to the forward signal prior to its amplification; and
the reverse test point provides access to the reverse signal subsequent to its amplification.

12. The amplifier of claim 10, wherein:
the test circuit is connected between the second port and the second diplex filter;
the forward test point provides access to the forward signal subsequent to its amplification; and
the reverse test point provides access to the reverse signal prior to its amplification.

13. A communication system for processing forward and reverse signals, the communication system comprising:
headend equipment for transmitting a forward signal and for receiving and processing a reverse signal;
subscriber equipment for receiving and processing the forward signal and for generating the reverse signal;
a communication medium coupled between the headend equipment and the subscriber equipment; and
an electronic device coupled to the communication medium for processing and forwarding both the forward signal and the reverse signal, the electronic device comprising:
a test circuit having a forward test point coupled to the forward signal, a reverse test point coupled to the reverse signal, and a single directional coupler coupled to the communication medium and connected to the forward test point, for providing the forward signal thereto, and to the reverse test point, for providing the reverse signal thereto.

14. The communication system of claim 13, wherein the communication system is a cable television system.

15. The communication system of claim 13, wherein the electronic device is an amplifier for amplifying the reverse signal and the forward signal.

16. The communication system of claim 15, wherein the amplifier further comprises:
a first port coupled to the communication medium for receiving the forward signal and for outputting an amplified reverse signal generated by the subscriber equipment;

a second port for outputting an amplified forward signal and for receiving the reverse signal;

a first diplex filter coupled to the first port for filtering signals at the first port to provide the forward signal to a first gain stage that generates the amplified forward signal; and a second diplex filter coupled to the second port for filtering signals at the second port to provide the reverse signal to a second gain stage that generates the amplified reverse signal.

17. The communication system of claim 16, wherein:

the test circuit is connected between the first port and the first diplex filter;

the forward test point provides access to the forward signal prior to its amplification; and the reverse test point provides access to the amplified reverse signal.

18. The communication system of claim 16, wherein:

the test circuit is connected between the second port and the second diplex filter;

the forward test point provides access to the amplified forward signal; and the reverse test point provides access to the reverse signal prior to its amplification.

* * * * *